United States Patent
Kwok et al.

[11] Patent Number: 5,403,778
[45] Date of Patent: Apr. 4, 1995

[54] LIMITED METAL REACTION FOR CONTACT CLEANING AND IMPROVED METAL-TO-METAL ANTIFUSE CONTACT CLEANING METHOD

[75] Inventors: Siang P. Kwok, Dallas; Shoue-Jen Wang, Plano, both of Tex.

[73] Assignee: Texas Instruments Incorporated, Dallas, Tex.

[21] Appl. No.: 178,208

[22] Filed: Jan. 6, 1994

[51] Int. Cl.⁶ .............................................. H01L 21/44
[52] U.S. Cl. ..................................... 437/188; 437/202; 437/922
[58] Field of Search ................. 437/188, 202, 922; 257/530; 148/DIG. 1, DIG. 17, DIG. 55

[56] References Cited

U.S. PATENT DOCUMENTS

| | | | |
|---|---|---|---|
| 5,166,556 | 11/1992 | Hsu et al. | 437/922 |
| 5,242,851 | 9/1993 | Choi | 437/922 |
| 5,298,784 | 3/1994 | Gambino et al. | 257/530 |
| 5,322,812 | 6/1994 | Dixit et al. | 437/922 |

Primary Examiner—Brian E. Hearn
Assistant Examiner—Chandra Chaudhari
Attorney, Agent, or Firm—Jacqueline J. Garner; Richard L. Donaldson; William E. Hiller

[57] ABSTRACT

An antifuse contact (30) cleaning method and the resulting antifuse (10) uses limited-reaction Ti/α-Si contact cleaning. The method includes the steps of placing a limited-reaction metal such as Ti (22, 24, 34) at the interface of a metal (20)/α-Si (32)/metal (36) antifuse contact (30). The method is to react the thin reaction metal (22, 24, 34) at a temperature of less than approximately 450° C. to remove the native interface layer of the metal (20)/α-Si (32)/metal (36) antifuse to, thereby, clean the metal (20)/α-Si (32)/metal (36) antifuse contact (30).

13 Claims, 6 Drawing Sheets

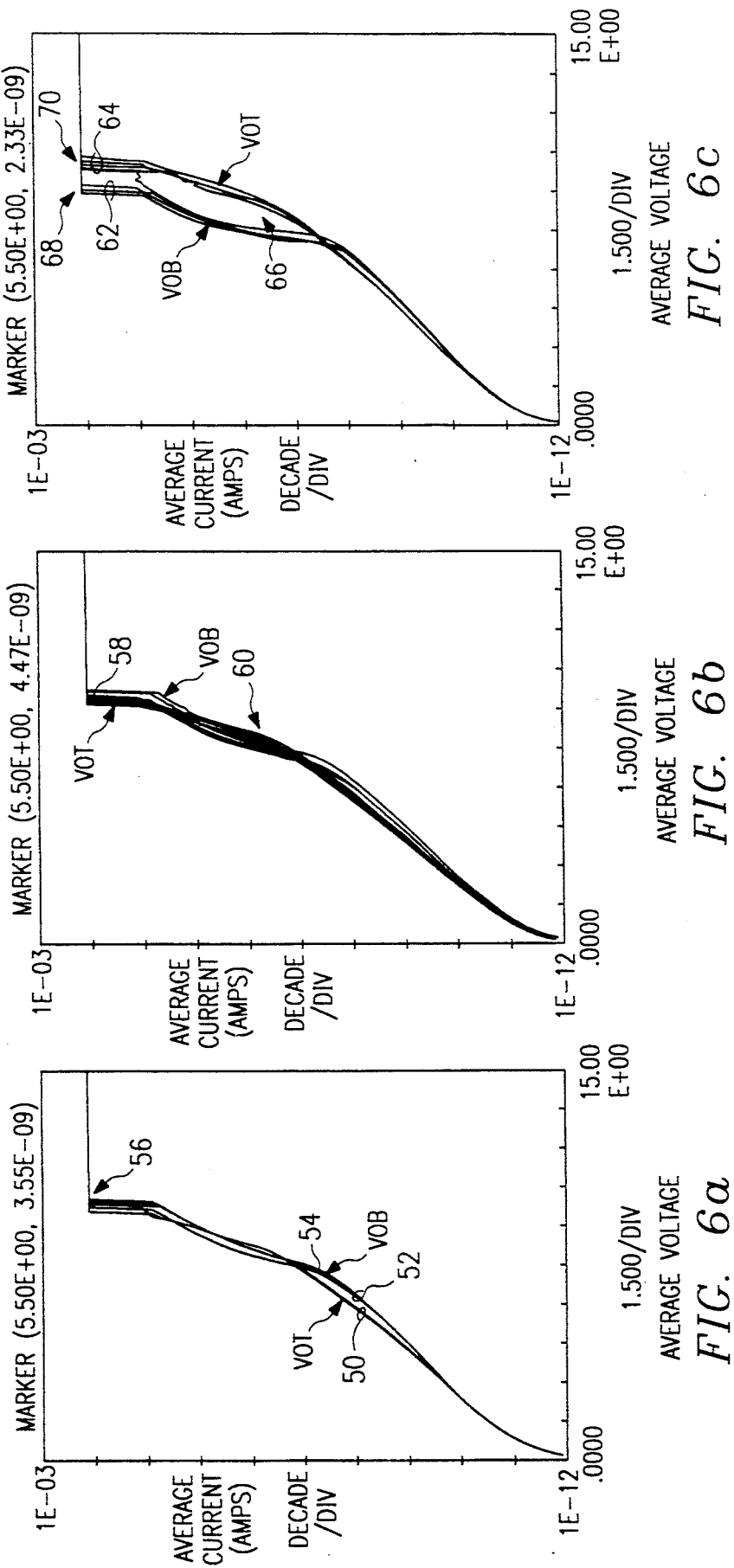

LIMITED METAL REACTION FOR CONTACT CLEANING AND IMPROVED METAL-TO-METAL ANTIFUSE CONTACT CLEANING METHOD

TECHNICAL FIELD OF THE INVENTION

The present invention relates generally to semiconductor devices and their fabrication and, more particularly, to an antifuse contact cleaning method and the antifuse resulting therefrom that involves limited reaction of titanium with amorphorous silicon to yield an improved metal/amorphus-silicon/metal antifuse for a wide variety of applications, including for use in field programmable gate arrays.

BACKGROUND OF THE INVENTION

Conventional methods of fabricating integrated electronic circuits set all internal circuit connections during the manufacturing process. However, because of high development costs and high manufacturing tooling costs of such circuits, new designs are emerging that permit a user to configure or program integrated circuits for specific applications in the field after their purchase. Such circuits are called user-programmable circuits, and they permit a user to program the electrical connections of the circuit by either selectively opening or closing a series of programmable links. The programmable links are electrical interconnects that are electronically forced electrically open or closed at selectable nodes in the circuit by the user after the integrated circuit has been packaged.

An antifuse, which is one type of programmable link, permits a user to program the integrated circuit by creating a short between two conductors to which the originally open antifuse connects. Antifuses consist typically of two conductor or semiconductor elements that have a dielectric or insulating material sandwiched between them. During programming, the dielectric is broken down at selected points between the conductive elements by a current developed from a predetermined programming voltage applied to the conductive elements of selected links. This electrically connects the conducting or semiconducting elements to the conductive elements.

One type of user-programmable circuit known as a field programmable gate array (hereinafter FPGA) uses an interlayer of amorphous silicon (hereinafter $\alpha$-Si) sandwiched between two metal layers. The metal layers are inert and form a diffusion barrier for the $\alpha$-Si. The barrier prohibits interdiffusion of metal and $\alpha$-Si at the contact interfaces during the high temperature fabrication process. Refractory metals such as TiW, W, or TiN are prime examples of the barrier metals. However, in order to form a metal/$\alpha$-Si/metal antifuse with reproducible electrical characteristics, it is necessary to remove the unwanted native interface layer of the contact through sputter cleaning the metal and $\alpha$-Si. This is done immediately prior to deposits of $\alpha$-Si and metal. Sintering the antifuse at high temperatures is the next step. Meanwhile, when the antifuse is programmed, it is necessary that sufficient reaction and interdiffusion of the metal and $\alpha$-Si occur in order to form a low-resistance and stable fused link.

The conventional use of barrier metal such as TiW requires at least the sputter cleaning of $\alpha$-Si prior to the deposition of the top metal. Thereafter, a high temperature annealing process occurs (e.g., at temperatures near or in excess of 450° C.) to react the TiW top metal to the $\alpha$-Si of the antifuse. There are numerous limitations associated with this type of process.

The sputtering process and the high temperatures of the annealing process stress the antifuse and adversely affect its final operation. Sputter cleaning of the antifuse at the scale of the antifuse is a somewhat uncontrolled process that often causes corner thinning of the antifuse vias, as shown in FIG. 1a. FIG. 1b shows the cross section of the antifuse without sputter clean. The thickness of the $\alpha$-Si at the center of via is 1250 Å and at the corner 1060 Å. FIG. 1b shows corner thinning of $\alpha$-Si after sputter cleaning at 1KW of RF power. The thickness of $\alpha$-Si at the center is 500 Å and at the corner 250 Å. This often results in a non-uniform breakdown voltage of the antifuse and a lack of symmetry in the antifuse current polarity. At best, the process window for sputter cleaning is critical. The high temperature process that anneals the TiW top layer has the adverse effect of causing excessive outleakage or outdiffusion of hydrogen in the $\alpha$-Si. The result of the excessive hydrogen outdiffusion is increased leakage current of the unprogrammed antifuse and increased defect density of the $\alpha$-Si due to loss of hydrogen to passivate the Si dangling bonds. In addition, the use of barrier metal such as TiW limits the fusing of the metal with the $\alpha$-Si during programming, resulting in higher fused resistance or higher programming current, which limits the speed of the circuit operation or the packing density of the circuit. Insufficient fusing reaction between the $\alpha$-Si and the metal will also lead to instability (switching off or increase) of the fuse link resistance.

SUMMARY OF THE INVENTION

A need exists, therefore, for a method and system to perform metal/$\alpha$-Si/metal antifuse contact cleaning that avoids both the sputter process and the high temperature annealing process of the conventional contact cleaning methods.

A need exists for an antifuse contact cleaning method and apparatus that eliminates or substantially reduces the uncontrolled corner thinning of antifuse vias that leads to non-uniform breakdown voltages and asymmetries of the antifuse polarity.

A further need exists for a metal/$\alpha$-Si/metal antifuse contact cleaning method that avoids the excessive outdiffusion of hydrogen that occurs in the high-temperature annealing process of known antifuse contact cleaning methods. Such a system would maintain the hydrogen passivation of silicon dangling bonds in the $\alpha$-Si, thus keeping defect density and leakage current low.

A need exists to reduce the resistance of programmed metal/$\alpha$-Si/metal antifuse to increase the speed of the circuit or reduce the programming current, which increases the packing density of the circuit.

A further need exists to form a stable programmed fuse link through sufficient fusing reaction between the $\alpha$-Si and the metal at minimum programming current possible.

The present invention, accordingly, provides a limited-reaction Ti/$\alpha$-Si process for metal/$\alpha$-Si/metal antifuse contact cleaning that eliminates or substantially reduces limitations and disadvantages associated with prior antifuse contact cleaning methods and improves the antifuse programmed resistance and its reliability resulting therefrom.

According to aspect of the present invention, there is provided a method for cleaning metal/$\alpha$-Si/metal antifuse contacts and for improving its programmed resistance and reliability that includes the steps of placing a thin reaction metal, such as Ti, at the interface of the metal/α-Si/metal antifuse contact. The resultant structure is metal/Ti/α-Si/Ti/metal or metal/Ti/α-Si/metal, where the metal is a good diffusion barrier for α-Si. A next step is to react the thin reaction metal at a temperature of less than approximately 450° C. to remove the native interface layer of the metal/α-Si/metal antifuse and, thereby, clean the metal/α-Si/metal antifuse contact.

Thin reaction metal such as Ti is needed in order to limit the interfacial reaction and interdiffusion of the metal and α-Si during the fabrication process involving the temperature cycle lower than 450 C. By limiting the Ti and α-Si reaction and interdiffusion, the present inventions allows control of leakage current and breakdown voltage of the antifuse. Keeping the process temperature below 450° C., limits hydrogen passivation and, thus preserves the quality of the α-Si material. On the other hand, at a much higher fusing temperature than 450° C. during programming, the presence of Ti provides a strong metal and α-Si reaction and interdiffusion to form low resistance and stable fuse link. One of the more important direct applications of the present invention is in forming antifuses for field programmable gate arrays (FPGAs). Other types of user-programmable integrated electronic circuits, however, may easily use the method and resulting antifuse of the present invention.

A technical advantage of the present invention is that it avoids the sputter process and high temperature annealing that conventional methods require. The process uses a more reliable titanium deposition followed by a controllable low temperature reaction. As such, the present invention reduces uncontrolled corner thinning of the antifuse vias. Additionally, the present invention avoids adverse effects to antifuses that out-diffusion of hydrogen causes. This eliminates non-uniform breakdown voltages and polar asymmetries of the breakdown voltage that often result from conventional antifuse contact cleaning methods.

Another technical advantage of the present invention is that it lowers the programmed resistance and helps yield a more reliable antifuse for high speed FPGA and other user-programmable integrated circuit applications. Because the antifuses that result from the process of the present invention are more reliable, the general reliability of integrated circuit improves. Since user-programmable integrated circuit technologies are emerging, this improved reliability benefits this technology area generally and makes it more applicable and acceptable for a variety of uses.

A further technical advantage of the present invention is that it provides improved polar symmetry of the breakdown voltage. This makes it possible to use antifuses formed according to the present invention for symmetrical currents. Symmetrical current designs permit a circuit designer to increase circuit layout densities on integrated circuits. This, also, has significant beneficial effects for designers and manufacturers of FPGAs and other user-programmable integrated circuits.

BRIEF DESCRIPTION OF THE DRAWINGS

The present invention is best understood by reference to the following detailed description of illustrative embodiments, when read with a view to the accompanying Figures, wherein:

FIGS. 6a, 6b and 6c show further aspects of the voltage and current characteristics of an antifuse formed according to the present embodiment with Ti on the top electrode only.

DETAILED DESCRIPTION OF ILLUSTRATIVE EMBODIMENTS

The present invention can be understood more fully by referring to the following detailed description of illustrative embodiments when read together with the accompanying Figures wherein like numerals are used for like and corresponding parts.

In conventional cleaning methods for user-programmable integrated circuit antifuses, sputter cleaning of antifuses often results in uncontrolled corner thinning of the α-Si and non-uniformities in the antifuse breakdown voltage. The present invention overcomes these problems by providing a limited-reaction Ti/α-Si technique in which a thin reactive metal is reacted with Si to form a more stable TiSi or Ti-rich intermetallic compound. This compound is useful to remove the native interfacial layer of the antifuse. Removal of this layer improves the antifuse breakdown voltage uniformity. This, in turn, improves the operation of the associated antifuse, in particular, and the further associated user-programmable integrated circuit, in general.

The method of the present embodiment can be optimized at a significantly lower temperature than prior methods. This limits undesirable hydrogen out-diffusion in the antifuse and leads to improved antifuse stability. The method encompasses placing a thin reaction metal such as Ti at the metal/α-Si/metal interface of the antifuse. This reaction metal may, for example, have a thickness of 50 nm or less. After placing the reaction metal on the metal/α-Si/metal interface, the process reacts the metal with α-Si at a temperature lower than 450° C. This removes the unwanted native interface layer.

Figure 1A:
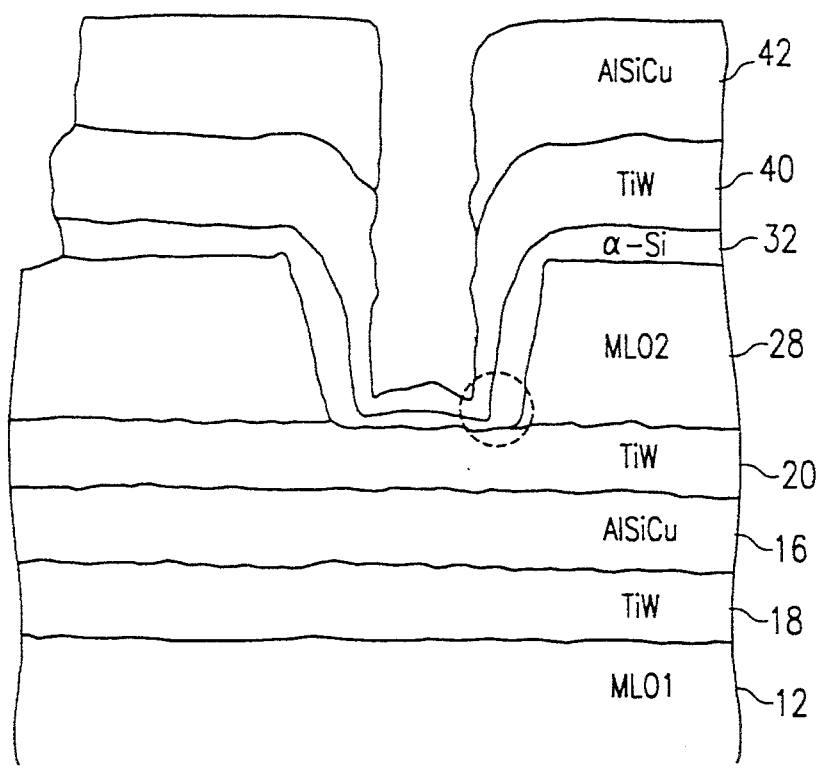
FIGS. 1a and 1b are scanning electron microscope cross-sectional views of antifuses formed, respectively, with and without sputter cleaning that illustrate the environment of the present embodiment.
Figure 1B:
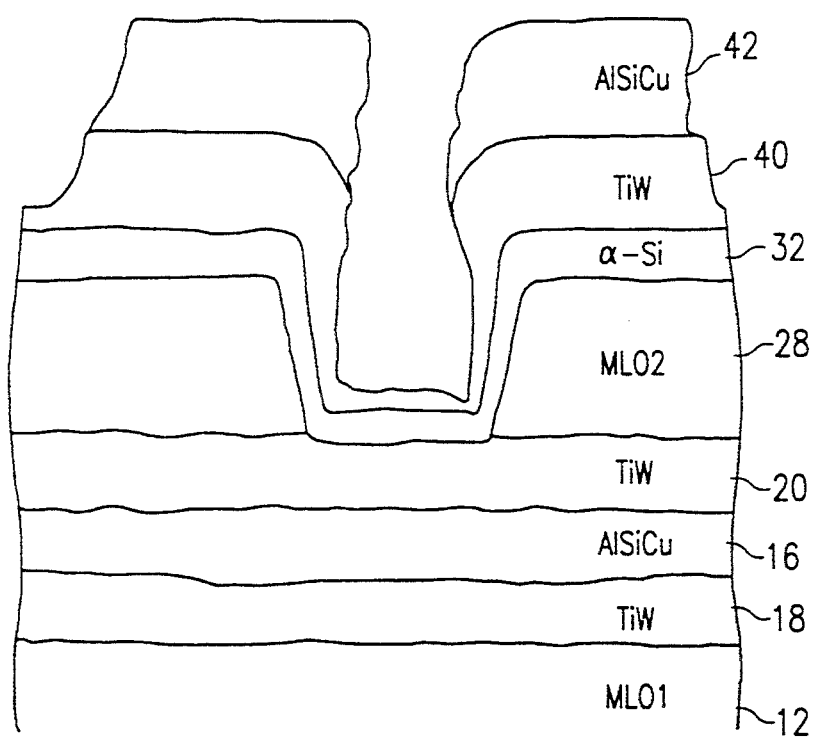
Figure 2:
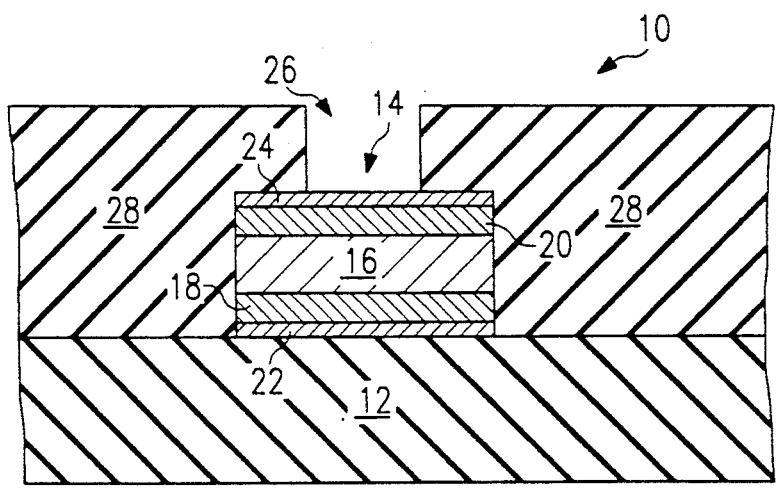
FIG. 2 illustrates an example of an antifuse formation process in accordance with the present embodiment.

Referring to FIG. 2, there appears the beginning of an antifuse fabrication process flow to illustrate certain aspects of the present method. In FIG. 2, antifuse 10 includes multi-level oxide 1 (ML01) layer 12 on which appears metal layer 14. Metal layer 14 includes AlSiCu layer 16 that is sandwiched between TiW layers 18 and 20 on the bottom and top, respectively. Titanium layers 22 and 24 cover the other sides of TiW layers 18 and 20. Multi-level oxide 2 (ML02) layer 28 covers metal oxide layer 12 and metal layer 14, except for opening 26, which is the via opening for the antifuse.

In the example of FIG. 2, exact thicknesses or proportions are not essential to practicing the invention.

They, however, are provided here as guidelines for making the illustrated embodiment. ML01 layer 12, therefore, may have an arbitrary thickness of 5,000 to 7,000 Å. Metal layer 14 may have a width of 2.2 μm, for example, with a height or thickness of approximately 1.21 μm. Individual layer approximate thicknesses for metal layer 14 include AlSiCu layer 16 having a thickness 4,500 Å, TiW layers 18 and 20 each with a thickness of 3,000 Å, and titanium layers 22 and 24 with a thickness of 800 Å. Layer 24 is the reaction metal at the bottom interface of the antifuse, which may be optional depending on the deposition process of the α-Si used. Titanium layer 22 is part of metal structure, but not of the antifuse and, therefore, may be optional. The presence of reactive titanium on at least one side of the α-Si is required in this embodiment. The portion of metal oxide layer 28 that covers metal layer 14 may have a thickness of approximately 0.6 μm or less. Also, antifuse via opening 26 may have a diameter of 0.8 μm, for example.

Figure 3:
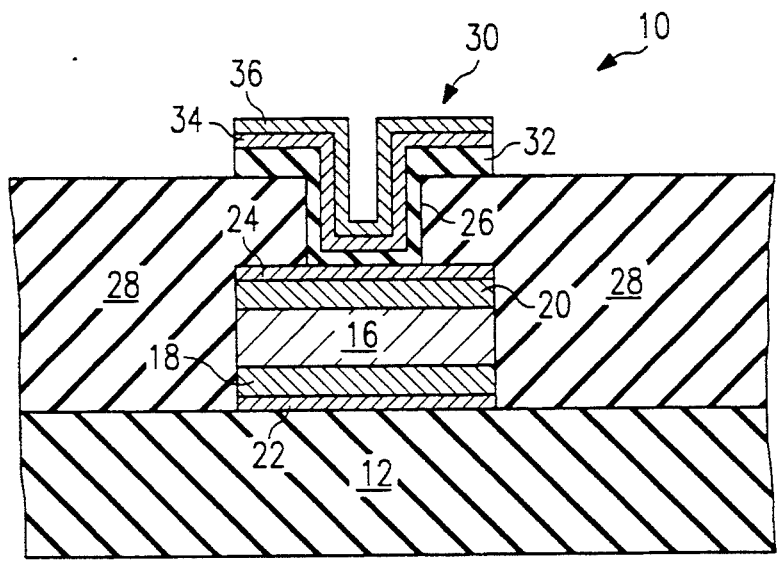
FIG. 3 shows further steps of the antifuse formation process of FIG. 2.

FIG. 3 shows that the next steps in the antifuse formation process include depositing and delineating the α-Si/Ti/TiW antifuse contact top structure 30 for antifuse 10. Within antifuse via opening 26 and partly covering ML02 layer 28 is antifuse contact top structure 30. Antifuse contact top structure 30 includes α-Si layer 32 that contacts titanium layer 24. Covering α-Si layer 32 is titanium layer 34. TiW layer 36 covers titanium layer 34. In the embodiment of FIG. 3, α-Si layer 32 has a thickness of 2,000 Å. External to antifuse via opening 26, titanium layer 34 has a thickness of approximately 500 Å. TiW layer 36 has a thickness of approximately 1,000 Å.

Figure 4:
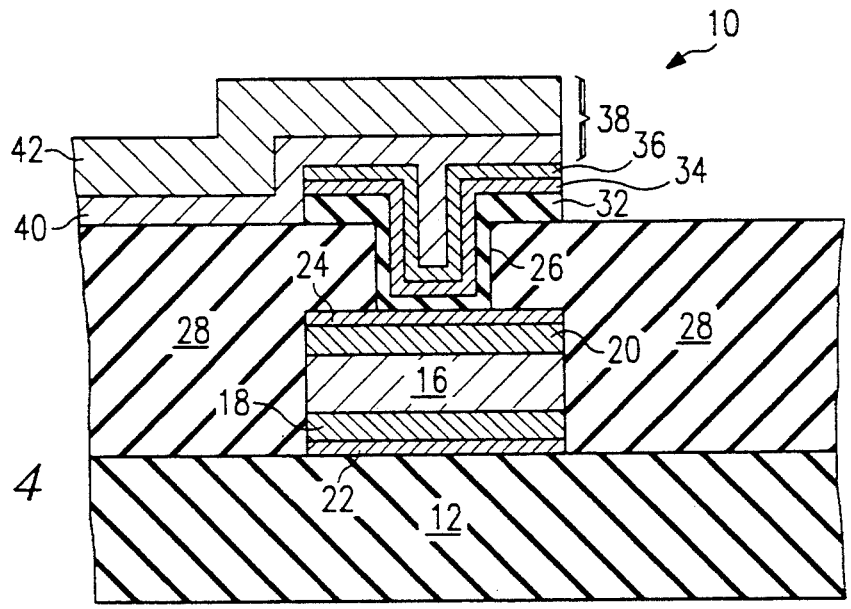
FIG. 4 shows yet further steps of the antifuse formation process of FIGS. 2 and 3.

FIG. 4 shows the results of further steps in completing antifuse 10 that include the steps of depositing and delineating metal layers 38. On top of TiW layer 36, another TiW layer 40 is added. On TiW layer 40 is a layer of AlSiCu. Adding these layers completes the process of forming antifuse 10 and includes the process of depositing thin titanium layers 34 and 24 that react with α-Si to provide the desired contact cleaning of the α-Si native interface layer. This is due to the plasma-enhanced chemical vapor deposition (PECVD) of the α-Si layer 32 taking place in a chemical environment at elevated temperature of 250° C. to 400° C. The bottom interface of layer 32 in contact with the barrier metal, such as TiW, formed may be adequate, the need of bottom Ti layer 24 may be optional. In this case, the bottom interface of layer 32 is in direct contact with barrier metal layer 20.

The antifuse structure 10 is then passivated with 200 nm of PECVD oxide and sintered at a temperature from 350° C. to 425° C. (typically 400° C.) to cause a limited reaction between the α-Si and Ti to form stable contacts. Finally, 1 μm thick plasma nitride is deposited on top, and the pad contact is delineated.

Figure 5:
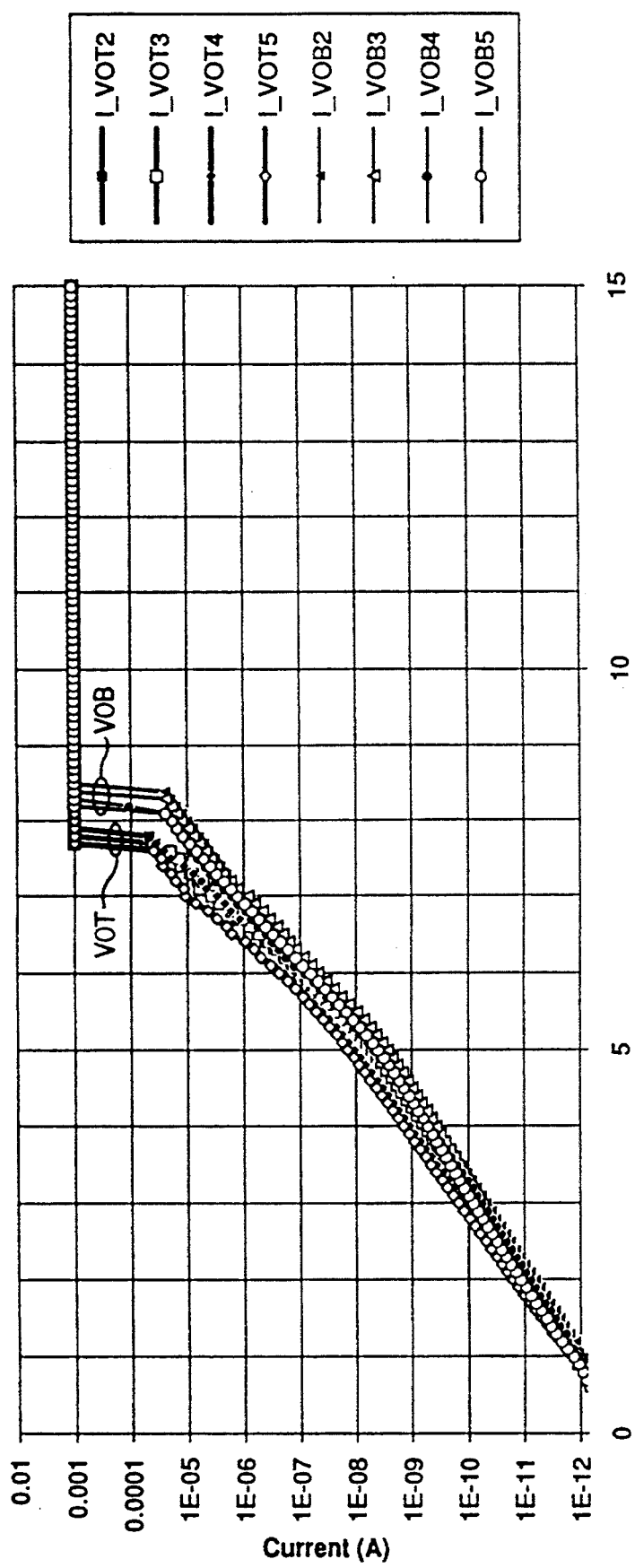
FIG. 5 depicts a family of curves that show voltage and current characteristics of antifuses formed according to the present embodiment.

FIG. 5 is a family of graphs that show voltage and current characteristics of antifuses formed according to the present embodiment. As the FIG. 5 graphs illustrate, the breakdown voltage and current relationships for the voltage-on-top (VOT) and voltage-on-bottom (VOB) applications are uniform and stable for different voltage and current values.

FIG. 5 even further shows the current-voltage characteristics of the illustrative antifuse embodiment shown in FIG. 4. The antifuse has been sintered at 425° C. Each group of curves represent the current-voltage characteristics of four antifuses on four different sites on the same wafer biased VOT and VOB. The polar nonsymmetry of the breakdown voltage is relatively small, a difference of about 1 volt. The VOT current is somewhat above the VOB at the 425° C. With further optimization and lower temperature improved symmetry is expected.

As an illustration of the Ti limited reaction contact cleaning, FIGS. 6a, 6b and 6c show the current-voltage characteristics of three different types of antifuses, constructed as illustrated in structure 10 of FIG. 3, but without the bottom Ti layers 22 and 24 (TiW/Ti/α-Si/-TiW). 50 nm, 20 nm and 0 nm top titanium thicknesses were used as layer 34 in FIGS. 6a, 6b, and 6c, respectively. The sinter temperature of 450° C. in forming gas for 30 minutes was used for all. The curves represent the traces of four antifuses biased with VOT metal and four with VOB metal for each wafer.

FIGS. 6a, 6b, and 6c illustrate the results of the formation process of the present embodiment relative to the prior antifuse contact cleaning process. In particular, for each of the plots of FIGS. 6a, 6b, and 6c, the vertical axis indicates current in the range from $10^{-12}$ amps to $10^{-3}$ amps. The horizontal axis measures breakdown voltage and ranges from 0 to 15 volts. Referring to FIG. 6a, a titanium layer thickness of 500 Å was used. The sets of VOT curves 50 and VOB curves 52 were used to measure leakage current and breakdown voltage. With the voltage on the bottom of the antifuse, VOB curves 52 were produced. As VOB curves 52 indicate, the breakdown voltage was approximately 9.5 volts at which point the current levels at 1 milliamp. VOT curves 50 show the results for the voltage on the top of the antifuse. The gap between the VOB curves 52 and VOT curves 50 indicates the polar asymmetry of the leakage current of the antifuse.

The plot of FIG. 6a shows that within a very tight tolerance the breakdown voltage at point 56 is approximately the same for both the VOB configuration of curves and the VOT configurations of curve 50. FIG. 6b shows similar results for a titanium layer thickness of approximately 200 Å. Again, at point 58 essentially uniform breakdown voltage occurs. Also, the assymmetry in leakage current is minimal as the closeness of the curves for the various VOB and VOT curves indicate. Reference numeral 60 in FIG. 6b collectively indicates these curves.

The results of FIG. 6a and 6b differ substantially from the results of FIG. 6c. FIG. 6c shows both the leakage current and breakdown voltage differences for the VOB and VOT testing configurations of a metal/α-Si/-metal antifuse that uses no thin reaction Ti layer. This process uses only the anneal process of the TiW layer without the sputter process to clean prior to depositing the TiW layer. As FIG. 6c illustrates, the family of VOB curves 62 represent the VOB configuration. The VOT curves 64 indicate the positive voltage in the top testing configuration. The large gap 66 between VOB curves 62 and VOT curves 64 shows the substantial polar asymmetry of leakage current that results in the two testing configurations. Additionally, the difference between breakdown voltage level 68 for VOB curves 62 and the breakdown voltage level 70 for the VOT curves 64 indicates the polar asymmetry of the breakdown voltage of the antifuses without limited Ti reaction.

Symmetric antifuse breakdown voltage means that circuits such as FPGA can be programmed from either VOT or VOB polarity for flexibility. High packing density of the programming circuit requires the degree of flexibility that this symmetry makes possible. This minimizes the programming voltage spread between the maximum programming voltage and provides a minimum allowable breakdown voltage. The smaller the spread is the less is the probability of accidental programming of unwanted antifuses.

Figure 7A:
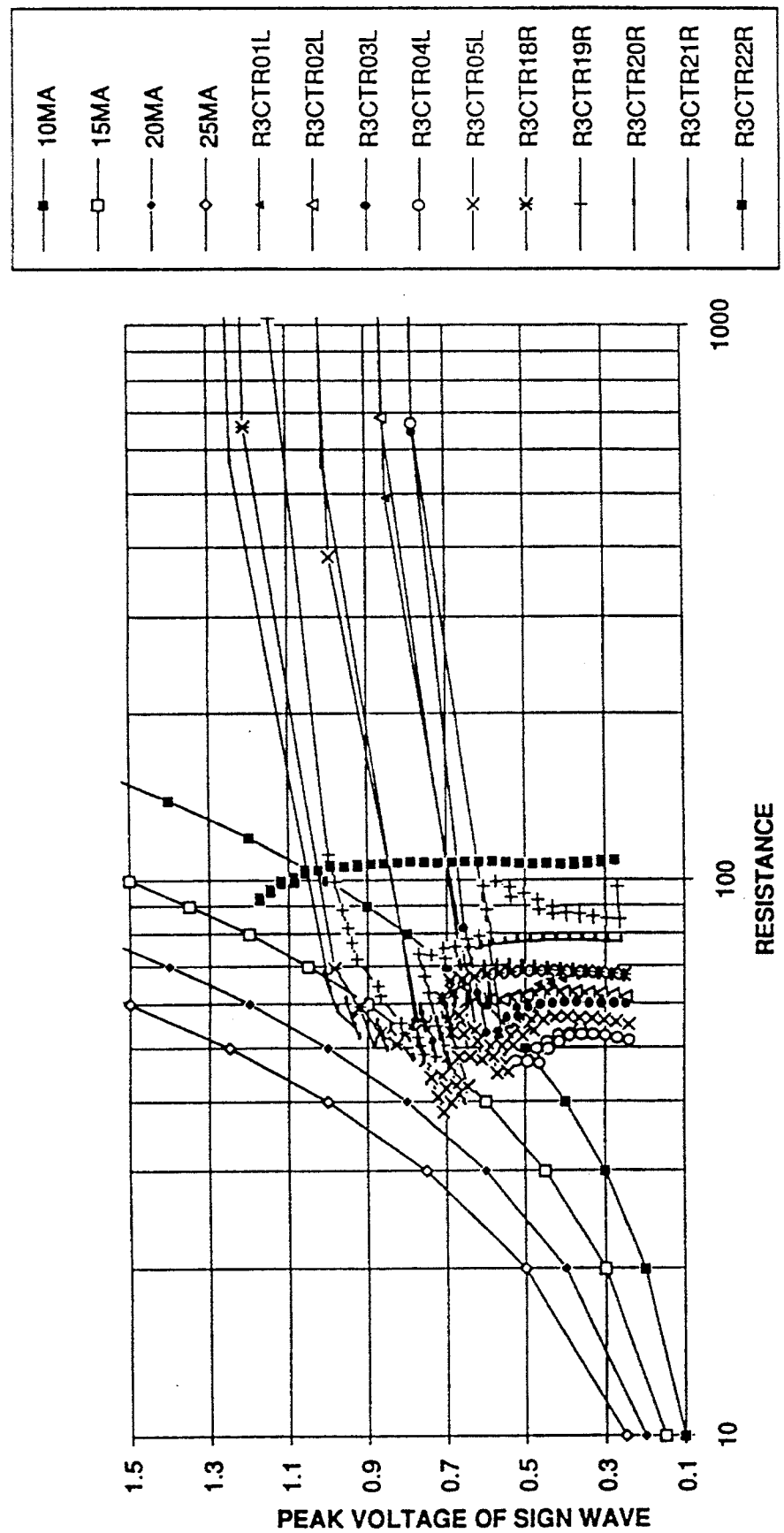
FIGS. 7a and 7b illustrate the voltage and resistance characteristics of a variety of programmed antifuses formed according to the present embodiment under current step stressing.
Figure 7B:
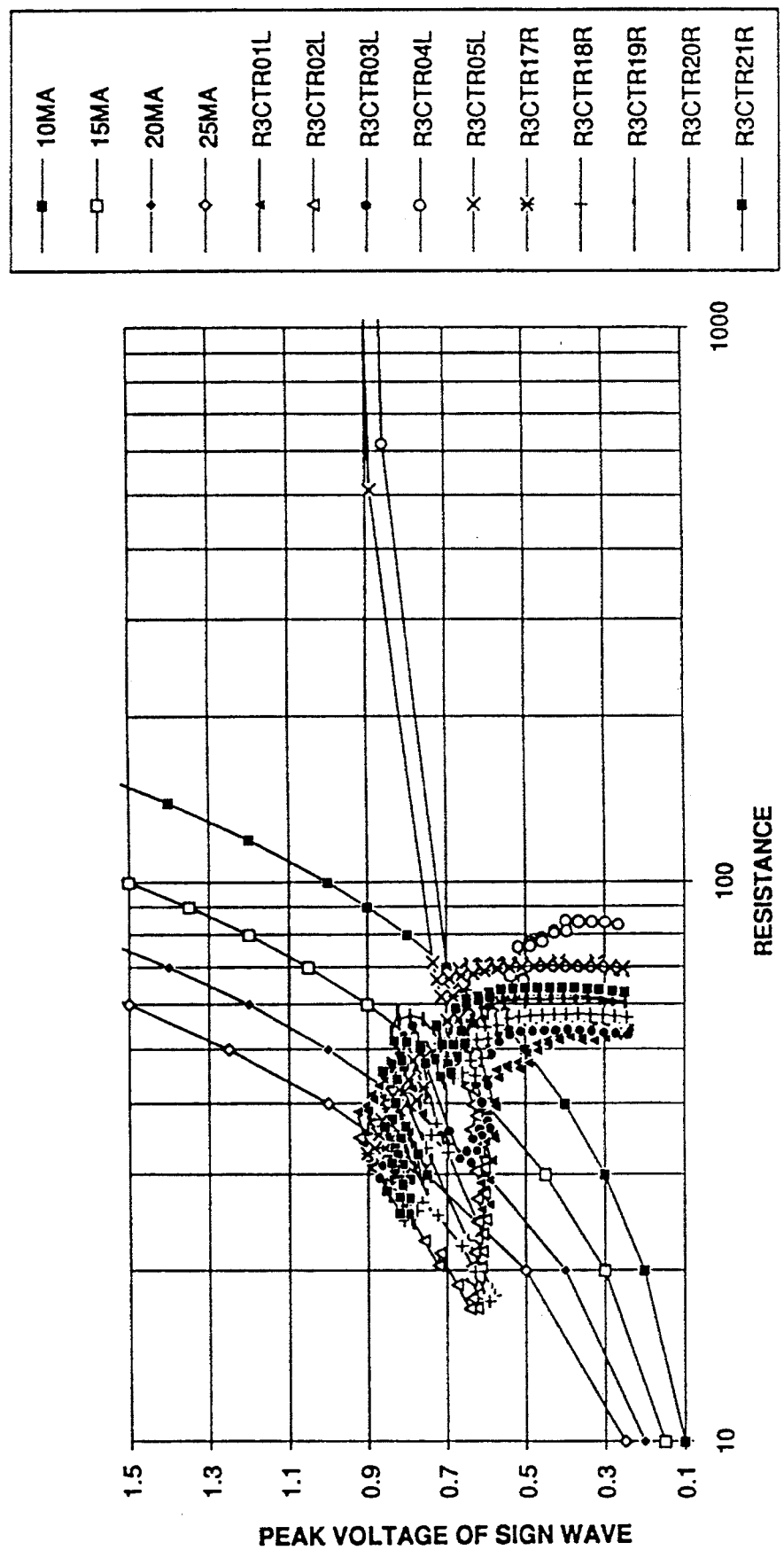

FIGS. 7a and 7b show the results of step stressing of programmed antifuses for the conventional TiW antifuse and Ti limited reaction of this invention embodiment respectively. For each group, five antifuses were programmed at 16 mA for 50 milliseconds with VOT and 5 antifuses with VOB. The programmed antifuses were then voltage-step stressed at 100 KHz starting from about 0.25 V. The resistance was measured for a duration of 20 seconds. Then, the stress peak voltage was stepped up and the resistance measured every 20 seconds until the fuse link resistance switched to high resistance (i.e., higher than 1000 Ohms) or the stress current went beyond 30 mA. The family contour curves of constant stress current of 10, 15, 20 and 25 mA are super-imposed on the FIGS. 7a and 7b. Nine out of ten of the conventional TiW antifuses of FIG. 7a have their fuse link resistance switch to the high resistance value, while only two of the Ti reacted antifuses of FIG. 7b switch. Moreover, for the majority of the antifuses the resistance actually decreased as the stress voltage increased. Clearly, the Ti reacted antifuse can withstand much higher stress current than can the conventional TiW antifuse.

The present embodiment has numerous applications in antifuse technology. One particular valuable example of its use is with the approach described in U.S. patent application Ser. No. 08/178,185 by S. P. Kwok and entitled "Pillar for Antifuse Bottom Contact," filed on Jan. 06, 1994, and assigned to Texas Instruments of Dallas, Tex. (hereinafter "Kwok"). For purposes of this use, the description of Kwok is incorporated by reference.

In summary, the present embodiment provides both a method and a resulting antifuse from the method of cleaning antifuse contacts that uses a limited-reaction Ti/α-Si process. The present embodiment includes the steps of placing a thin reaction metal such as titanium at the interface of a metal/α-Si/metal antifuse contact. After placing the reaction metal at the interface, the next step is to react the thin reaction metal at a temperature of less than 450° C. to remove the native interface layer of the metal/α-Si/metal antifuse to, thereby, clean the metal/α-Si/metal antifuse contact.

Although the invention has been described with reference to the above specified embodiments, this description is not meant to be construed in a limiting sense. Various modifications of the disclosed embodiment, as well as alternative embodiments of the invention will become apparent to persons skilled in the art upon reference to the above description. It is, therefore, contemplated that the appended claims will cover such modifications that fall within the true scope of the invention.

What is claimed is:

1. A method for cleaning metal/α-Si/metal antifuse contacts, comprising the steps of:
    placing a reaction metal at the interface of a metal/α-Si/metal antifuse contact;
    reacting the reaction metal at a temperature of less than approximately 450° C. to remove the native interface layer of the metal/α-Si/metal antifuse to, thereby, clean the metal/α-Si/metal antifuse contact.

2. The method of claim 1, wherein said placing step further comprises the step of placing a Ti layer at the interface of said metal/α-Si/metal antifuse contact.

3. The method of claim 1, wherein said reacting step comprises the step of reacting a Ti layer with the native interface layer.

4. The method of claim 1, further comprising the step of forming a via over said antifuse contact.

5. The method of claim 1, further comprising the step of associating said metal/α-Si/metal antifuse contact with an antifuse.

6. The method of claim 1, further comprising the step of associating said cleaned metal/α-Si/metal antifuse with a user-programmable integrated circuit.

7. The method of claim 1, further comprising the step of associating said cleaned metal/α-Si/metal antifuse with a field programmable gate array.

8. A method of forming a user-programmable integrated circuit, comprising the steps of:
    forming an antifuse for a user-programmable integrated circuit;
    forming a metal/α-Si/metal antifuse contact for association with the antifuse, including the step of cleaning the antifuse contact by placing a reaction metal at a metal/α-Si interface of the metal/α-Si/metal antifuse contact;
    reacting the reaction metal at a temperature of less than approximately 450° C. to remove the native interface layer of the metal/α-Si/metal antifuse contact, and thereby, clean the metal/α-Si/metal antifuse contact.

9. The method of claim 8, further comprising the step of forming said antifuse from layers of AlSiCu and TiW.

10. The method of claim 8, further comprising the step of fabricating said user-programmable gate array as a field programmable gate array.

11. The method of claim 8, further comprising the step of cleaning the metal/α-Si/metal antifuse contact by placing a TI layer at the interface of said metal/α-Si/metal antifuse contact and reacting the Ti layer with the native interface layer.

12. The method of claim 8, further comprising the step of forming said metal/α-Si/metal antifuse contact of TiW and α-Si.

13. The method of claim 8, further comprising the step of placing the metal/α-Si/metal antifuse contact over the antifuse.

* * * * *